United States Patent
Takigawa

(10) Patent No.: US 9,871,342 B2
(45) Date of Patent: Jan. 16, 2018

(54) AIR-COOLED LASER DEVICE HAVING HEAT-TRANSFER MEMBER WITH HEAT RADIATING FINS

(71) Applicant: FANUC CORPORATION, Minamitsuru-gun, Yamanashi (JP)

(72) Inventor: Hiroshi Takigawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/053,166

(22) Filed: Feb. 25, 2016

(65) Prior Publication Data
US 2016/0254643 A1 Sep. 1, 2016

(30) Foreign Application Priority Data
Feb. 26, 2015 (JP) .................... 2015-037102

(51) Int. Cl.
| | | |
|---|---|---|
| H01S 3/04 | (2006.01) | |
| H01S 5/024 | (2006.01) | |
| H01S 5/02 | (2006.01) | |
| H01S 5/022 | (2006.01) | |
| H01S 5/40 | (2006.01) | |

(52) U.S. Cl.
CPC ...... H01S 5/02407 (2013.01); H01S 5/02469 (2013.01); *H01S 5/02* (2013.01); *H01S 5/02248* (2013.01); *H01S 5/4025* (2013.01)

(58) Field of Classification Search
CPC .. H01S 5/02469; H01S 5/02407; H01S 5/024; H01S 3/041; H01S 3/0014; H01S 3/0407; H01S 3/04; H01S 3/00
USPC ....... 372/34, 35, 36; 353/58, 61; 361/679.47
See application file for complete search history.

(56) References Cited

U.S. PATENT DOCUMENTS

| | | | | |
|---|---|---|---|---|
| 2005/0231913 A1* | 10/2005 | Malone | .............. | H05K 7/20772 361/698 |
| 2010/0118902 A1* | 5/2010 | Wu | .......................... | H01S 5/024 372/36 |
| 2011/0197596 A1* | 8/2011 | Cheng | ..................... | F28D 15/00 62/3.2 |
| 2013/0175021 A1* | 7/2013 | Takigawa | ............... | H05K 7/209 165/185 |

FOREIGN PATENT DOCUMENTS

| | | |
|---|---|---|
| EP | 2 933 593 A1 | 10/2015 |
| JP | 2001358486 A | 12/2001 |

(Continued)

*Primary Examiner* — Tuan Nguyen
(74) *Attorney, Agent, or Firm* — RatnerPrestia

(57) ABSTRACT

A compact and inexpensive air-cooled laser device, having heat radiating fins configured to sufficiently cool a heat-receiving member thermally connected to a laser diode module positioned within a housing of the laser device having a substantially sealing structure. A flow direction of air flowing between heat radiating fins of a first fin set and a flow direction of air flowing between heat radiating fins of a second fin set are generally opposed to each other. Further, the first and second fin sets are positioned adjacent to each other, and thus an inflow area of the first fin set and an outflow area of the second fin set are also adjacent to each other. Therefore, most of the air after flowing between the fins of the first fin set is deflected by colliding with an inner wall of a housing, and then enters between the fins of the second fin set.

5 Claims, 5 Drawing Sheets

(56) References Cited

FOREIGN PATENT DOCUMENTS

| JP | 2008-021899 | * | 1/2008 | ............ H01S 3/042 |
|----|----|----|----|----|
| JP | 2008-021899 A | | 1/2008 | |
| JP | 2009177337 A | | 8/2009 | |
| JP | 2009-239166 | | 10/2009 | |
| JP | 2012-059952 A | | 3/2012 | |
| JP | 201518640 A | | 1/2015 | |
| WO | WO 2014/92057 A1 | | 6/2014 | |

* cited by examiner

AIR-COOLED LASER DEVICE HAVING HEAT-TRANSFER MEMBER WITH HEAT RADIATING FINS

BACKGROUND OF THE INVENTION

1. Field of the Invention

The present invention relates to an air-cooled type laser device having a laser diode as a light emitting source or an excitation light source, and having a structure for radiating heat generated from the laser diode.

2. Description of the Related Art

Generally, in a laser device, having a laser diodes (or semiconductor lasers) as a light emitting source or an excitation light source, there are two types, i.e., an air-cooled type in which heat generated by a laser diode module including a laser diode is radiated by air; and a water-cooled type which is connected to a circulation type cooling water supply device (or a chiller).

The air-cooled type laser device is more advantageous than the water-cooled type, in that the air-cooled type is easily moved, an occupied area thereof is small, restrictions of an installation location thereof are few, and an installation cost thereof is low, etc. However, in the air-cooled type, it is difficult to decrease the temperature of the laser diode module to the same degree of the water-cooled type. In particular, since a high-power laser device must have many laser diode modules having a large amount of heat generation, it is necessary to provide an effective heat radiating structure to the laser device in order to prevent the laser device from having to be increased in size.

As a relevant prior art document, JP 2008-021899 A discloses a laser oscillator having a semiconductor laser heat radiating member to radiate heat generated by a semiconductor laser array, a fiber laser heat radiating member to radiate heat generated by an optical fiber for a fiber laser, a cooling fan for sending cooling air, and a guide member for guiding the cooling air from the cooling fan.

JP 2012-059952 A discloses a structure for cooling an electronic device, including a heat radiator having an L-shaped heat pipe, a plurality of heat radiating fins attached to a substantially horizontal part of the heat pipe, and a heat receiving plate to which substantially vertical portions of the heat radiating fins are attached; a plurality of electronic devices attached to the heat receiving plate; and a container for containing the plurality of electronic devices.

JP 2009-239166 A discloses a flat heat sink including: a plurality of thin plates layered having an air guiding portion and a hollow portion for containing a centrifugal fan, the thin plated being layered with a certain gap therebetween; at least one heat radiating fin part connected to ends of the thin plates, in which air guided by the air guiding portion of the thin plates flows through the heat radiating fin part; and at least one heat pipe, having one end which is thermally connected to the portion of the thin plate thermally connected to a heating component and the other end which is thermally connected to the heat radiating fin part, in which at least a part of the heat pipe is positioned so as to form a space between the thin plates and the heat pipe.

Further, WO 2014/092057 A1 discloses a cooling unit having a heat receiving block thermally connected to an electronic component constituting a heating element, a heat pipe vertically positioned on the heat-receiving block and configured to receive and transfer heat of the heat-receiving block, and a plurality of heat radiating fins arranged on the heat pipe. The heat radiating fins are constituted by a first fin set arranged on a linear portion of the heat pipe and a second fin set arranged on a bent portion of the heat pipe.

In an open-type air-cooled laser device, in which external air is sucked as cooling air into the laser device, and the air heated by a laser diode in the laser device is discharged from the laser device, when the outside air temperature (or the ambient temperature) of the laser device is increased, the temperature of the air sucked into the laser device is also increased, whereby it is difficult to effectively cool the laser diode. Therefore, in order to extend a life of the laser diode module and improve reliability thereof, a panel cooler may be used so as to cool the air within a housing (or the laser device) having a substantially sealing structure, and a heat radiating fin set may be cooled by the cooled air, in which the fin set is thermally connected to a heat-receiving member which receives heat from the laser diode.

However, in a laser device having a high optical output (i.e., having a laser diode module with a large amount of heat generation), it is necessary to arrange a large fin set (in particular, having a large inflow area) in the laser device in order to sufficiently lower the temperature of the heat-receiving member, whereby the housing (or the laser device) may be increased in size.

The above related art documents do not provide a sufficient solution for solving the above problems. For example, although an open-type air-cooled laser oscillator is disclosed in FIG. 5 of JP 2008-021899 A, it is necessary to reflux the air discharged from an outlet port into an inlet port again and arrange a flow path therefor, when the laser oscillator is positioned in a housing having a substantially sealing structure. Further, in order to obtain high cooling characteristics, it is necessary to circulate a large amount of air at a high velocity. Accordingly, it is necessary to increase a cross sectional area of the flow path, whereby the device is increased in size. When the device is increased in size, an installation area and a weight thereof are also increased. Further, due to increase in a surface area of the device, a heat input from the outside to the device is also increased, whereby it is necessary to use a panel cooler having high cooling capability, by which a device cost and an operation cost thereof are increased.

SUMMARY OF THE INVENTION

The object of the present invention is to provide a compact and inexpensive air-cooled laser device, having heat radiating fins configured to sufficiently cool a heat-receiving member thermally connected to a laser diode module positioned within a housing of the laser device having a substantially sealing structure.

The present invention provides an air-cooled laser device having a laser diode module positioned in a housing having a substantially sealing structure, the air-cooled laser device comprises: a plurality of heat radiating fins attached to a heat-transferring member thermally connected to the laser diode module via a heat-receiving member; and a fan for sending air through between the plurality of heat radiating fins, wherein the plurality of heat radiating fins includes a first fin set and a second fin set, a flow direction of air flowing between the heat radiating fins of the first fin set and a flow direction of air flowing between the heat radiating fins of the second fin set are generally opposed to each other, and the fan is configured so that air of at least 50 volume percent, among the air flowing out between the heat radiating fins of the first fin set, flows between the heat radiating fins of the second fin set.

In a preferred embodiment, the heat-transferring member is a heat pipe.

In a preferred embodiment, the laser device comprises a cooling unit for cooling the air heated by the laser diode module. For example, the cooling unit is a panel cooler positioned adjacent to the housing. Further, an air guiding plate may be arranged in the housing so that cold air from the panel cooler is directed toward the fan.

In a preferred embodiment, a partition plate is arranged between the air flowing between the heat radiating fins of the first fin set, and the air flowing between the heat radiating fins of the second fin set.

BRIEF DESCRIPTION OF THE DRAWINGS

The above and other objects, features and advantages of the present invention will be made more apparent by the following description of the preferred embodiments thereof, with reference to the accompanying drawings, wherein.

DETAILED DESCRIPTION

Figure 1:
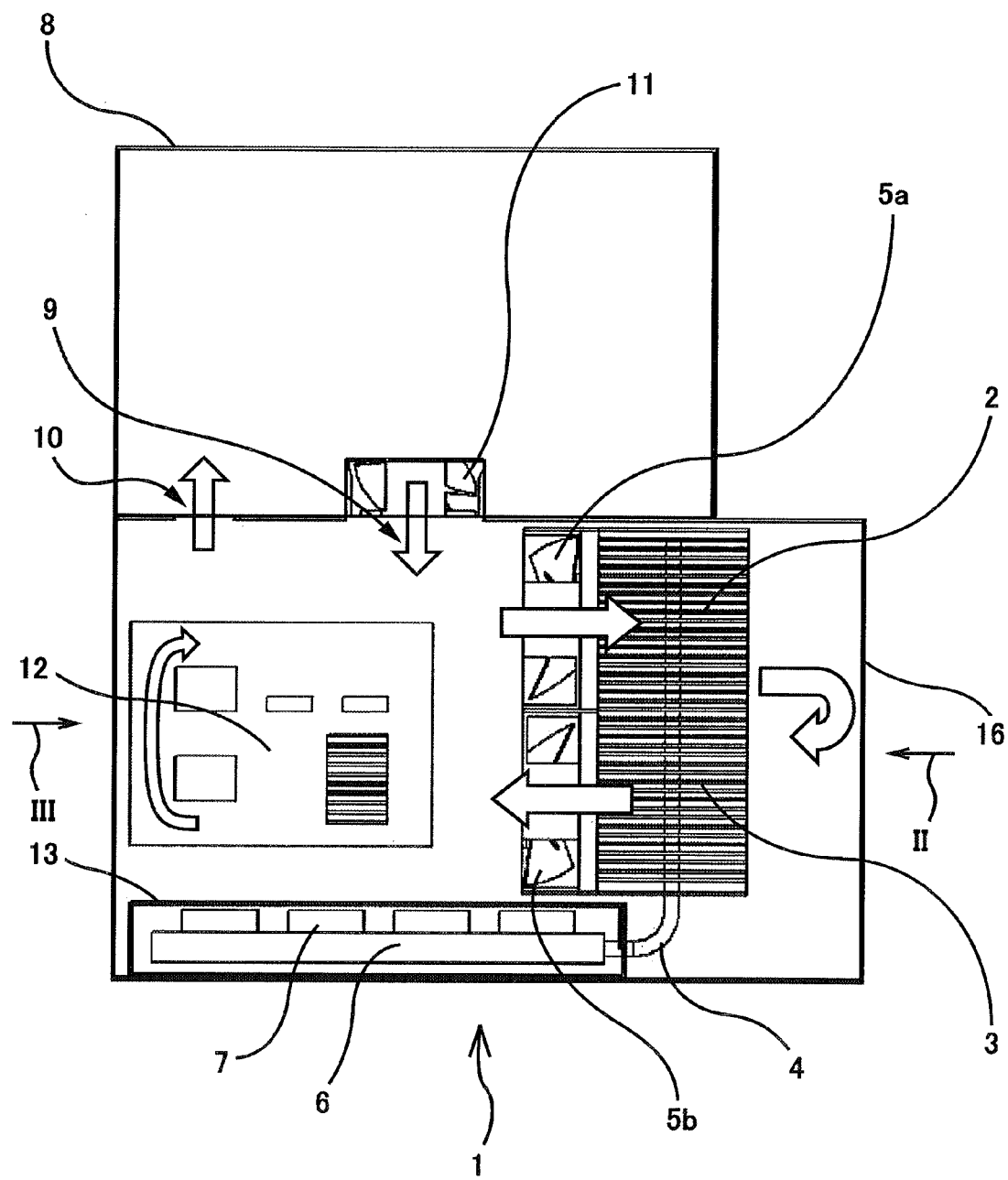
FIG. 1 is a cross-sectional view showing a schematic configuration of an air-cooled laser device according to a first embodiment of the present invention.
Figure 2:
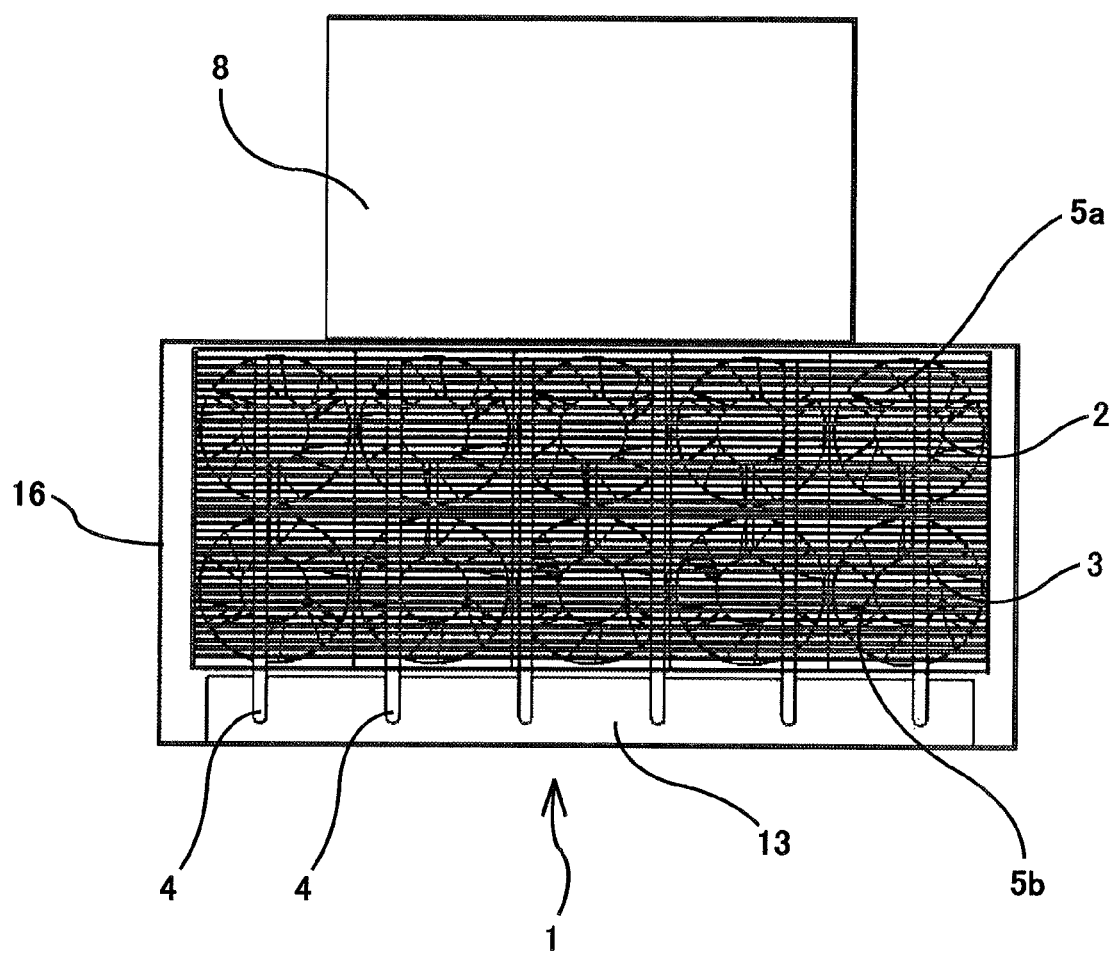
FIG. 2 is a schematic view showing an inside space of the air-cooled laser device of FIG. 1, viewed from a side where heat radiating fins are positioned.
Figure 3:
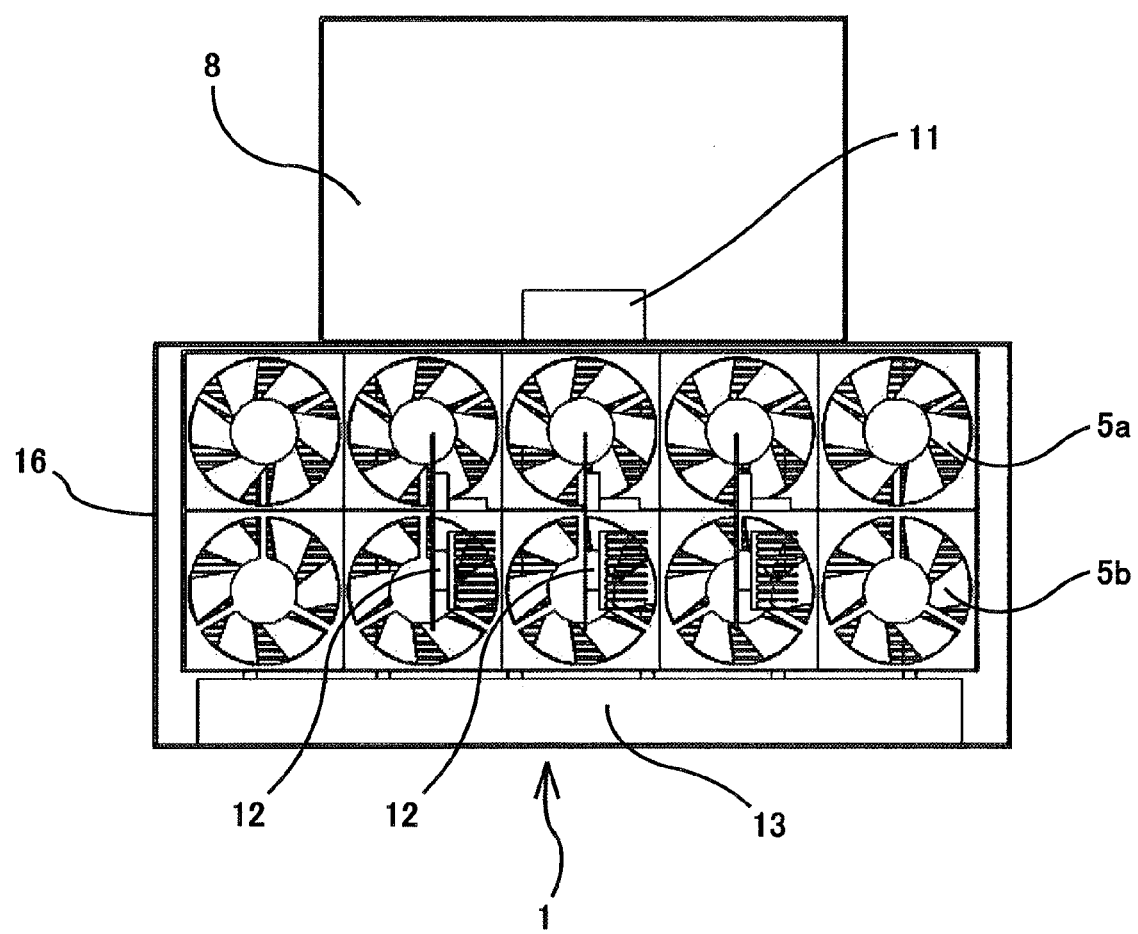
FIG. 3 is a schematic view showing the inside space of the air-cooled laser device of FIG. 1, viewed in a direction opposed to the direction of FIG. 2.

FIGS. 1 to 3 show a schematic configuration of an air-cooled laser device 1 according to a first embodiment of the present invention, and FIG. 1 is a cross-sectional view of air-cooled laser device 1. Air-cooled laser device 1 has: at least one (normally, a plurality of) laser diode module 7 including at least one laser diode chip or laser diode array; a heat-receiving member 6 substantially horizontally-arranged, on which laser diode modules 7 are mounted so as to be thermally connected to heat-receiving member 6; at least one L-shaped heat-transferring member 4 attached to an inside or a surface of heat-receiving member 6, L-shaped heat-transferring member 4 extending in a surface direction (or a direction substantially perpendicular to a thickness direction) of heat-receiving member 6 and bending at a substantially right angle outside heat-receiving member 6 so as to extend in a substantially upward vertical direction; a first heat radiating fin set 2 and a second heat radiating fin set 3 attached to a substantially vertical portion of L-shaped heat-transferring member 4 so that each heat radiating fin of the fin sets extends in a substantially horizontal direction; and axial fans 5a and 5b for sending air through between the fins of first fin set 2 and the fins of second fin set 3, respectively, and these components are incorporated in a housing 16 having a substantially sealing structure. In the first embodiment, air before flowing between the fins of first fin set 2 or after flowing between the fins of the second fin set 3 can cool a heating component 12 other than laser diode module 7, positioned in the upper space of heat-receiving member 6.

In FIG. 1, heat-receiving member 6 is illustrated as a substantially horizontally-arranged plate member (or a heat-receiving plate). In the first embodiment, laser diode modules 7 are mounted on the upper surface of heat-receiving plate 6. In this regard, laser diode modules 7 may be positioned on the lower surface or the both surfaces of heat-receiving plate 6. In addition, when laser device 1 is a fiber laser device having a laser diode as an excitation light source, the fiber laser, etc., may be mounted on heat-receiving plate 6.

From laser diode module 7 positioned on the upper surface of heat-receiving plate 6, heat is generated along with a laser beam output, and the generated heat is transferred to heat-receiving plate 6. Then, the heat is transferred to the heat radiating fins of fin set 2 or 3 via heat-transferring member 4, and is radiated from the fins to air flowing between the fins by axial fans 5a and 5b. By virtue of this, an increase in temperature of heat-receiving plate 6 (or laser diode modules 7) is limited.

Although it is preferable that heat-transferring member 4 be manufactured from a material such as copper having high thermal conductivity, the material is not limited to a particular material. It is preferable that a heat pipe be used as heat-transferring member 4, since the thermal conductivity of the heat pipe is substantially about a thousand times higher than the thermal conductivity of silver. By using the heat pipe, the difference in temperature between the laser diode module and the heat radiating fins can be significantly reduced. In particular, since a heat radiating part (or a low-temperature part) where operating fluid within the heat pipe is condensed extends in the substantially vertical direction, the condensed operating fluid is smoothly returned or refluxed to a high-temperature part positioned below, whereby a thermal resistance of the heat pipe can be reduced and the maximum amount of heat transport thereof can be increased.

Heat-receiving plate 6, on which laser diodes 7 are mounted, can be contained in a case 13 having a substantially sealing structure. By removing a lid on an upper surface of case 13 or removing a bottom plate of case 13, the operator can access at least one surface of heat-receiving plate 6, even when heat-receiving plate 6, heat-transferring member 4 and heat radiating fin sets 2, 3 are assembled. Therefore, the operator can attach the component to the plate and/or carry out maintenance of the component, etc. Further, by containing heat-receiving plate 6 in case 13, heat-receiving plate 6 and the components including laser diode module 7 mounted on heat-receiving plate 6 can be prevented from being heated by the heated air after flowing between the heat radiating fins.

In order to lower a thermal resistance between laser diode module 7 and heat-receiving plate 6, a thermally-conductive paste material may be arranged therebetween. Heat-transferring member 4 is inserted in a hole or a groove formed on heat-receiving member 6 so as to be thermally connected to heat-receiving member 6 with a low thermal resistance. It is preferable that heat-transferring member 4 extend in heat-receiving member 6 in the substantially horizontal direction, from the side of heat-receiving member 6 where heat-transferring member 4 is inserted to the opposed side, in order to minimize a temperature difference within heat-receiving member 6.

In FIG. 1, white or outlined arrows indicate the flow direction of the air at several positions in housing 16. In order to flow air between the fins of fin sets 2 and 3, is necessary to arrange a fan in housing 16 for pressurize or sucking the air between the fins. In this embodiment, axial fan 5*a* is arranged so as to pressurize between the fins of first fin set 2 positioned in a generally upper half region of housing 16, and thus the air flow between the fins from the left side to the right side as shown by the outlined arrow in FIG. 1. On the other hand, axial fan 5*b* is arranged so as to suck between the fins of second fin set 3 positioned in a generally lower half region of housing 16, and thus the air flow between the fins from the right side to the left side as shown by the outlined arrow in FIG. 1.

In other words, the flow direction of the air flowing between the heat radiating fins of first fin set 2 and the flow direction of the air flowing between the heat radiating fins of second fin set 3 are generally opposed to each other. Further, first fin set 2 and second fin set 3 are positioned adjacent to each other, and thus an inflow area of first fin set 2 and an outflow area of second fin set 3 are also adjacent to each other. As a result, most of the air after flowing between the fins of first fin set 2 is deflected by colliding with an inner wall of housing 16, and then enters between the fins of second fin set 3. Therefore, in the present invention, it is not necessary to arrange a separate flow path for refluxing the cooling air having at a certain flow rate. In this regard, the "most (of the air)" refers to at least 50 volume % (or not less than 50%), preferably, not less than 60%, not less than 70%, not less than 80%, or not less than 90%.

In a conventional air-cooled laser device having a substantially sealing structure, when air flows between all of fins in the same direction, it is necessary to arrange a separate flow path for refluxing the air, whereby the laser device may be increased in size or a heat input from the outside to the laser device may be increased (in particular, in a hot environment). However, in this embodiment, since it is not necessary to arrange a separate flow path in air-cooled laser device 1 for refluxing the air, housing 16 can contain a large fin set which occupies a generally entire area in housing 16. Therefore, a cooling efficiency of the laser device can be improved, resulting in that the laser device can be compact, a life of laser diode module 7 can be extended and the reliability thereof can be improved, by limiting an increase in temperature of heat-receiving member 6.

FIG. 2 is a view of air-cooled laser device 1, viewed from a side where heat radiating fin sets 2 and 3 are positioned (i.e., in a direction of an arrow II in FIG. 1), in which a lateral side of housing 16 is omitted or removed. Among ten axial fans positioned in housing 16, five fans 5*a* positioned on an upper level of housing 16 are configured to pressurize the air between the fins of first fin set 2, and five axial fans 5*b* positioned on a lower level of housing 16 are configured to suck the air between the fins of second fin set 3. In addition, in order to reduce a thermal resistance between the fins and heat-receiving member 6 and improve total fin efficiency by minimizing the temperature difference between each fin, six heat-transferring members (or heat-pipes), aligned in the substantially horizontal direction, are used.

FIG. 3 is a view of air-cooled laser device 1, viewed in a direction opposed to the direction of FIG. 2 (i.e., in a direction of an arrow III in FIG. 1), in which a lateral side of housing 16 is omitted or removed. As shown in FIG. 3, in a region where a cooling structure (constituted by case 13, heat-transferring member 4, fin sets 2 and 3, and fans 5*a* and 5*b*) does not occupy, one or more component 12 such as a power unit, etc., may be positioned. In this regard, when component 12 is positioned so that a projected area thereof with respect to the air flow direction is minimized, a flow resistance of the air is reduced, whereby the (reflux) flow of the air in housing 16 is not substantially blocked.

In general, in an air-cooled laser device having a substantially sealing structure, heat within the device cannot be easily radiated, and thus it is necessary to arrange a cooling unit for lowering the temperature of the air heated by a heating component, etc., within the laser device. For example, a heat exchanger may be used to exchange heat between the air within the device and external air. However, since the air within the device is increased as the ambient temperature is increased, it is preferable that a panel cooler 8, as exemplified in FIGS. 1 to 3, be arranged as the cooling unit for radiating the heat of laser diode module 7 toward outside of (housing 16 of) laser device 1. By using panel cooler 8, an increase in temperature of laser diode module 7 can be effectively limited even in a hot environment. In addition, in FIGS. 1 to 3, an inner structure of panel cooler 8, other than fan 11 for discharging cold air, is abbreviated in the drawing.

As shown in FIG. 1, when panel cooler 8 to be used is positioned adjacent to housing 16, housing 16 has a suction port 10 for taking a part of the air within housing 16 into panel cooler 8, and a discharge port 9 for introducing the (cold) air cooled by panel cooler 8 and sent by discharging fan 11 into housing 16. When panel cooler 8 is used, even if the air flows between all of the fins in the same direction, a reflux loop of the air including panel cooler 8 can be constituted. However, the flow rate of the air passing through panel cooler 8 is considerably smaller than the flow rate of the air flowing between the fins, in order to obtain sufficient cooling characteristics. Therefore, even when panel cooler 8 is used, a sufficient reflux flow rate cannot be obtained, unless the flow directions of the air are different between the fin sets as in the present invention.

Further, as shown in FIG. 1, it is preferable that heating component 12 and fan 5*a* or 5*b* be positioned in the vicinity of cold air discharge port 9 so that most of the cold air from panel cooler 8 flows between the fins. By virtue of this, most of the cold air from panel cooler 8 flows between the heat radiating fins (in the illustrated embodiment, the fins of first fin set 2), and thus an increase in temperature of laser diode module 7 can be effectively limited, whereby a life of laser diode module 7 can be extended and the reliability thereof can be improved.

Figure 4:
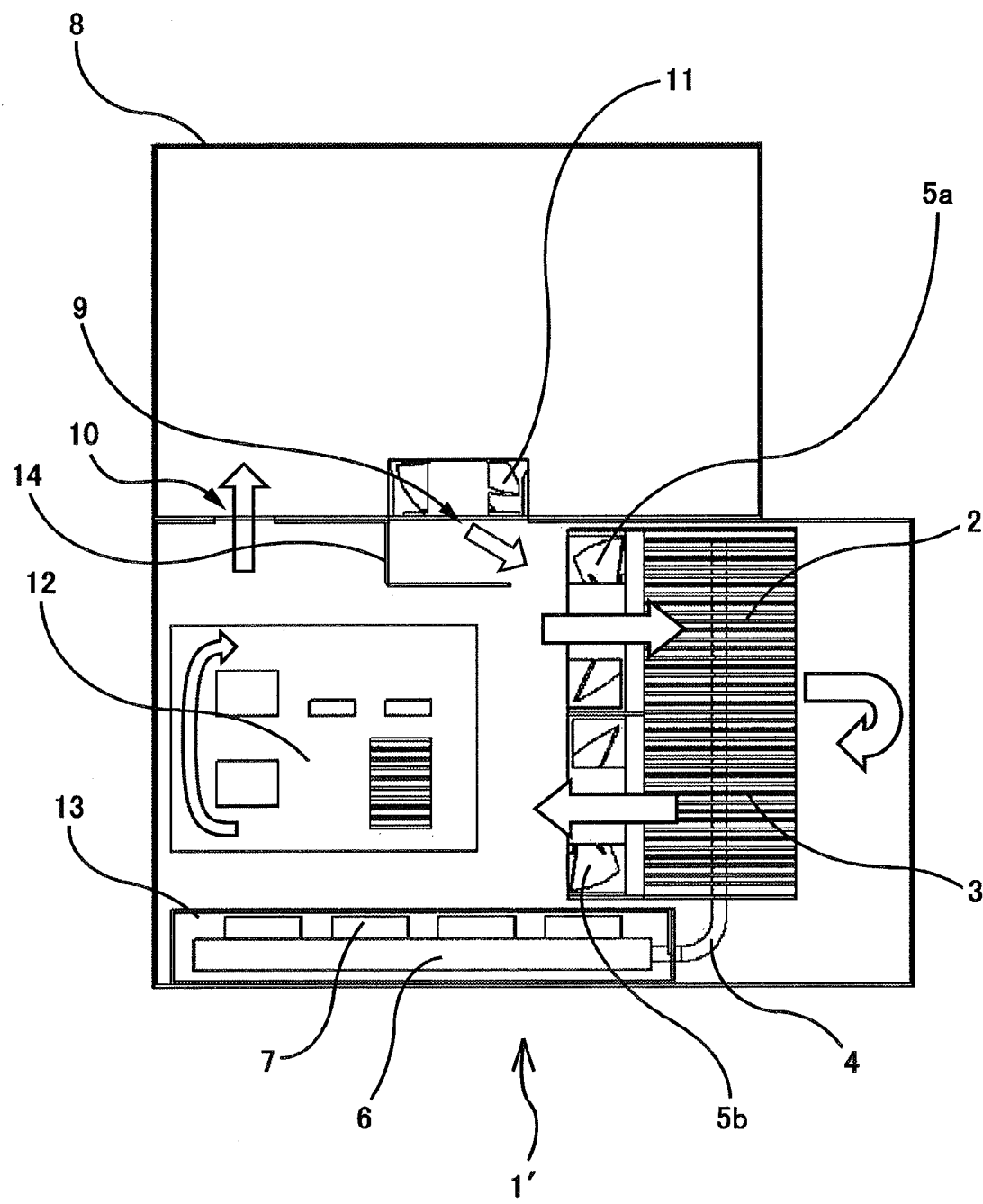
FIG. 4 is a cross-sectional view showing a schematic configuration of an air-cooled laser device according to a second embodiment of the present invention.

FIG. 4 is a cross-sectional view showing a schematic configuration of an air-cooled laser device 1' according to a second embodiment of the present invention. In the second embodiment, the same reference numerals are added to components substantially equivalent to the components of the first embodiment, and detailed explanations thereof will be omitted.

In the second embodiment, an air guiding plate 14 for guiding the cold air from panel cooler 8 toward axial fan 5*a* is arranged in the vicinity of discharge port 9 of housing 16. By using air guiding plate 14, the cold air from panel cooler 8 can easily flow between the fins. Therefore, an amount of heat radiation from the fins can be further increased, whereby an increase in temperature of laser diode module 7 can be further effectively limited.

Figure 5:
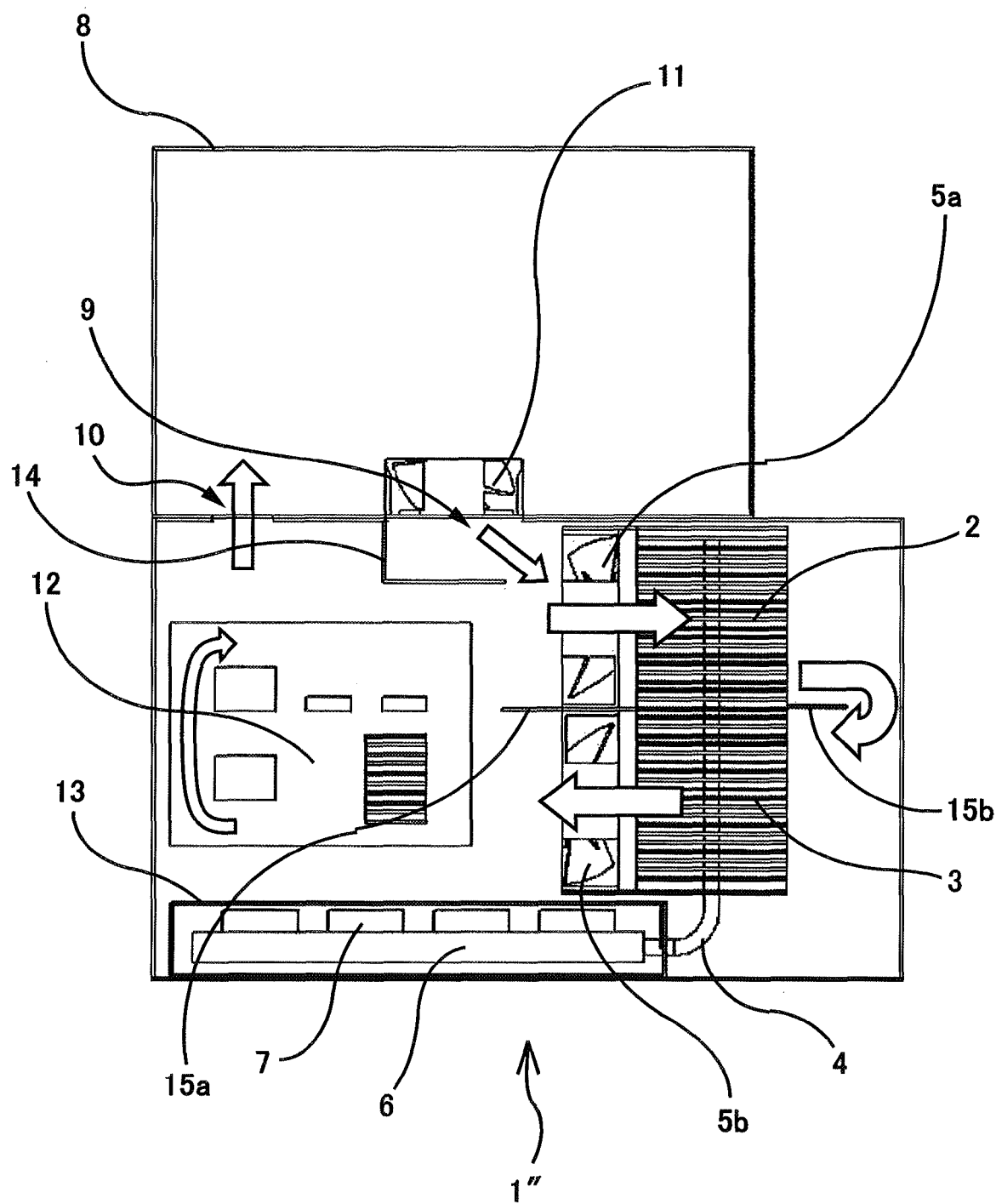
FIG. 5 is a cross-sectional view showing a schematic configuration of an air-cooled laser device according to a third embodiment of the present invention.

FIG. 5 is a cross-sectional view showing a schematic configuration of an air-cooled laser device 1" according to a third embodiment of the present invention. In the third embodiment, the same reference numerals are added to components substantially equivalent to the components of the second embodiment, and detailed explanations thereof will be omitted.

In the third embodiment, one or more partition plate is arranged between the air flowing between the heat radiating fins of first fin set 2, and the air flowing between the heat radiating fins of second fin set 3. Concretely, a partition plate 15*a* extending toward a suction side of axial fan 5*a* (or a delivery side of axial fan 5*b*) is positioned between fans 5*a* and 5*b*, and a partition plate 15*b* extending toward an outlet side of first fin set 2 (or an inlet side of second fin set 3) is positioned between fin sets 2 and 3.

By using partition plate 15*a*, the heated air after flowing between the fins of second fin set 3 is prevented from immediately flowing between the fins of first fin set 2. In other words, the heated (or relatively high temperature) air after flowing between the fins of second fin set 3 is sucked and cooled by panel cooler 8, or mixed with the cold air from panel cooler 8. Therefore, since the heated air flows between the fins of first fin set 2 after being cooled, whereby cooling efficiency of the heat radiating fins can be improved.

On the other hand, when partition plate 15*b* is not used, the air flows having the different directions (concretely, the air flowing out from the lowermost portion of first fin set 2 and the air flowing into the uppermost portion of second fin set 3) may be mixed with each other, and then the air flow may be disturbed by a vortex generated at a boundary between the air flows having the different directions. As a result, the pressure loss of the air may be increased and the reflux flow rate may be decreased. In this regard, by using partition plate 15*b*, such problems can be eliminated or decreased. Although the third embodiment uses both partition plates 15*a* and 15*b*, only one of the partition plates may be used.

Although the first, second and third embodiments uses heat-transferring member 4 having a substantially L-shape, the heat-transferring member may be formed as a rod-shaped (or a generally straight) member, and the straight member may be inserted in heat-receiving member 6 in the substantially vertical direction. In this case, in order to minimize the temperature difference within heat-receiving member 6, an additional heat-transferring member may be arranged, the additional heat-transferring member extending in the substantially horizontal direction, from a portion of heat-receiving member 6 where the rod-shaped heat transferring member is inserted, to a periphery of heat-receiving member 6.

According to the present invention, in the substantially sealing housing, the air can be refluxed within the housing, by flowing between the heat radiating fins of the first fin set and subsequently flowing between the heat radiating fins of the second fin set, without using a separate flow path for the reflux. Therefore, the air-cooled laser device of the present invention can be compact and manufactured at low cost.

While the invention has been described with reference to specific embodiments chosen for the purpose of illustration, it should be apparent that numerous modifications could be made thereto, by a person skilled in the art, without departing from the basic concept and scope of the invention.

The invention claimed is:

1. An air-cooled laser device, the air-cooled laser device comprises:
    a housing including:
        a laser diode module,
        a plurality of heat radiating fins attached to a common heat-transferring member thermally connected to the laser diode module via a heat-receiving member, the plurality of heat radiating fins including a first fin set and a second fin set adjacent to the first fin set, and
        at least one of a first fan adjacent to the first fin set for sending air through the plurality of heat radiating fins of the first fin set in a first flow direction, and a second fan adjacent to the second fin set for sending air through the plurality of heat radiating fins of the second fin set in a second flow direction generally opposite the first direction,
        wherein the heat transferring member, the first and second fin sets, and the first and second fans are positioned in the housing, and
        wherein at least 50 volume percent, among the air flowing through the heat radiating fins of the first fin set, flows through the heat radiating fins of the second fin set prior to flowing through the heat radiating fins of the first fin set again; and
    a cooling unit for cooling the air heated by the laser diode module, and
    wherein the housing and the cooling unit are a closed system with a substantially sealed structure, and are connected to each other through an inlet port for transferring the air heated by the laser diode module to the cooling unit, and an outlet port for discharging the cooled air into the housing.

2. The air-cooled laser device as set forth in claim 1, wherein the heat-transferring member is a heat pipe.

3. The air-cooled laser device as set forth in claim 1, wherein the cooling unit is a panel cooler positioned adjacent to the housing.

4. The air-cooled laser device as set forth in claim 3, wherein an air guiding plate is arranged in the housing so that cold air from the panel cooler is directed toward the fan.

5. The air-cooled laser device as set forth in claim 1, wherein a partition plate is arranged between the air flowing between the heat radiating fins of the first fin set, and the air flowing between the heat radiating fins of the second fin set.

* * * * *